United States Patent
Lo et al.

(10) Patent No.: US 9,024,679 B2
(45) Date of Patent: May 5, 2015

(54) STANDBY CHARGE PUMP SYSTEM

(75) Inventors: Su-Chueh Lo, Hsinchu (TW); Wenming Hsu, Zhubei (TW); Wu-Chin Peng, New Taipei (TW)

(73) Assignee: Macronix International Co., Ltd., Hsinchu (TW)

(*) Notice: Subject to any disclaimer, the term of this patent is extended or adjusted under 35 U.S.C. 154(b) by 152 days.

(21) Appl. No.: 13/330,165

(22) Filed: Dec. 19, 2011

(65) Prior Publication Data

US 2013/0027120 A1    Jan. 31, 2013

Related U.S. Application Data

(60) Provisional application No. 61/511,387, filed on Jul. 25, 2011.

(51) Int. Cl.
*G05F 1/10*     (2006.01)
*G11C 5/14*     (2006.01)

(52) U.S. Cl.
CPC ............... *G11C 5/145* (2013.01); *G11C 5/148* (2013.01)

(58) Field of Classification Search
CPC .............................................. H02M 3/07–3/08
See application file for complete search history.

(56) References Cited

U.S. PATENT DOCUMENTS

| | | | |
|---|---|---|---|
| 6,275,096 B1 | 8/2001 | Hsu et al. | |
| 6,429,725 B1 | 8/2002 | Tanzawa et al. | |
| 7,348,829 B2* | 3/2008 | Choy et al. | 327/536 |
| 7,656,221 B2* | 2/2010 | Maejima | 327/534 |
| 2007/0205824 A1* | 9/2007 | Perisetty | 327/536 |
| 2009/0240872 A1* | 9/2009 | Perlmutter et al. | 711/103 |
| 2010/0278001 A1 | 11/2010 | Cho | |
| 2011/0149675 A1 | 6/2011 | Chang et al. | |
| 2012/0275225 A1* | 11/2012 | Huynh et al. | 365/185.17 |

* cited by examiner

*Primary Examiner* — Sibin Chen
(74) *Attorney, Agent, or Firm* — Kenta Suzue; Haynes Beffel & Wolfeld LLP

(57) ABSTRACT

In one aspect, a charge pump output of a charge pump is coupled to a capacitor of a voltage shifter. The output of the voltage shifter causes pump control logic to enable the charge pump. In another aspect, a transistor in saturation has a drain terminal coupled to a charge pump output and a source terminal coupled to an output mode providing a word line read voltage.

20 Claims, 9 Drawing Sheets

STANDBY CHARGE PUMP SYSTEM

REFERENCE TO RELATED APPLICATION

This application claims the benefit of U.S. Provisional Patent Application No. 61/511,387 filed 25 Jul. 2011, which is incorporated herein by reference.

BACKGROUND

1. Field of the Invention

This technology relates to charge pump systems.

2. Description of Related Art

In high density memory arrays and nanoscale memory cells, a design requirement is to have the word line (WL) and bit line (BL) voltages ready on standby to perform a fast and accurate read operation. However, this design requirement increases standby current consumption which impacts power requirements on mobile devices with limited battery power.

An example standby pump system has a design goal of generating a stable read voltage VRD that is greater than the supply voltage VDD on standby. However, the generated read voltage is unstable, for reasons described below.

The pump system includes a detector and charge pump circuitry. RDPWR is a big node that connects to many devices, and suffers from high current leakage and heavy loading. However, an accurate read operation requires a stable read voltage.

The charge pump circuitry includes a weaker charge pump periodically enabled by signal ENPMP. The weaker charge pump is active when the detected voltage on the RDPWR node is less than the target read voltage VRD. During standby when awaiting a read command, the voltage variation on the RDPWR node is large, due to accuracy of the voltage detector described below, and the current pulse from the charge pump.

The charge pump circuitry also includes a stronger charge pump. Both charge pumps are enabled to support read current from the RDPWR node during a read operation. The signal ENRD enables the charge pumps when the integrated circuit accepts a read command.

A voltage detector detects the voltage on the RDPWR node. When the RDPWR node has a voltage less than the desired read voltage VRD due to charge leakage from the RDPWR node, then the ENPMP signal enables the weaker charge pump to replenish the leaked charge at the RDPWR node.

Node RDPWR is an example of detect-and-refresh. During the refresh phase, the node RDPWR is connected to an unregulated charge pump output, and is continuously ramping up. If voltage of node RDPWR ramps up too fast, or the voltage detector has slow response time, then the ENPMP pulse width might be too long. Then the voltage of node RDPWR seriously overshoots. The waveform would have large sawtooth.

The voltage detector utilizes a Zener diode or a resistive voltage divider to convert the voltage VRDPWR on the RDPWR node into a voltage VDIV that is less than the supply voltage VDD. A comparator in the voltage detector compares the voltages VDIV and VREF to determine whether to enable the weaker charge pump. However, both the Zener diode and the resistive voltage divider drain DC current from the voltage levels generated by the charge pump. This DC current drain seriously impacts standby current of the integrated circuit, since repeatedly generating high voltage with the charge pump is a heavy power drain.

Further disadvantages in the voltage detector are that the Zener diode device increases process cost, and the large resistors of a resistive voltage divider entail large circuit area, large parasitic capacitance, and slow response time.

SUMMARY

One aspect of the technology is an apparatus comprising a charge pump, a voltage shifter, and pump control logic. The charge pump has a charge pump output. The voltage shifter includes a capacitor having a first terminal coupled to the charge pump output, and a second terminal. The capacitor shifts a first voltage level at the first terminal to a second voltage level at the second terminal. The pump control logic enables the charge pump responsive to the second voltage level.

In one embodiment the voltage shifter blocks dc current from the charge pump output through the voltage shifter.

In one embodiment a voltage difference between the first voltage level and the second voltage level across the capacitor is set by a target voltage of the charge pump output.

In one embodiment a voltage difference between the first voltage level and the second voltage level across the capacitor is refreshed at a first refresh rate determined by a second refresh rate of the charge pump output.

Another aspect of the technology is a method comprising:

shifting a first voltage level at a first capacitor terminal of a capacitor coupled to a charge pump output of a charge pump to a second voltage level at a second capacitor terminal of the capacitor; and enabling the charge pump responsive to the second voltage level.

In one embodiment a voltage shifter including the capacitor blocks dc current from the charge pump output through the voltage shifter.

In one embodiment a voltage difference between the first voltage level and the second voltage level across the capacitor is set by a target voltage of the charge pump output.

In one embodiment a voltage difference between the first voltage level and the second voltage level across the capacitor has a first refresh rate determined by a second refresh rate of the charge pump output.

Another aspect of the technology is an apparatus comprising a transistor and charge pump circuitry. The transistor has a first current carrying terminal, a second current carrying terminal, and a control terminal. The first current carrying terminal is coupled to an output node providing a word line read voltage. The second current carrying terminal is coupled to a charge pump output of charge pump circuitry. The charge pump circuitry has the charge pump output and provides power to the output node via the transistor.

In one embodiment, the transistor is a field effect transistor, the first current carrying terminal is a source, the second current carrying terminal is a drain, and the control terminal is a gate.

In one embodiment, the transistor operates in a saturation region. In one embodiment, the voltage fluctuation at the charge pump output is decreased at the output node.

In one embodiment, charge leakage from the output node is counteracted by current flow through the transistor between the second current carrying terminal and the first current carrying terminal.

In one embodiment, the charge pump circuitry includes a second charge pump output coupled to the control terminal of the transistor. In one embodiment, a voltage regulator maintains a control terminal voltage at the control terminal.

In one embodiment, a first refresh rate of a control terminal voltage on the control terminal is determined by a second refresh rate of the charge pump output.

Another aspect of the technology is a method comprising:
operating a transistor in saturation, the transistor having a first current carrying terminal coupled to an output node providing a word line read voltage and a second current carrying terminal coupled to a charge pump output, such that voltage fluctuation at the charge pump output is decreased at the output node.

In one embodiment, the transistor is a field effect transistor, the first current carrying terminal is a source, the second current carrying terminal is a drain, and the control terminal is a gate.

In one embodiment, charge leakage from the output node is counteracted by current flow through the transistor from the second current carrying terminal to the first current carrying terminal.

One embodiment further comprises:
maintaining a control terminal voltage at the control terminal by charge pumping.

One embodiment further comprises:
refreshing a control terminal voltage on a control terminal of the transistor at rate determined by refresh rate of the charge pump output.

DETAILED DESCRIPTION

In the described system, capacitors are implemented to decrease constant DC current drain on the charge pumps. Such capacitors are refreshed periodically.

Figure 1:
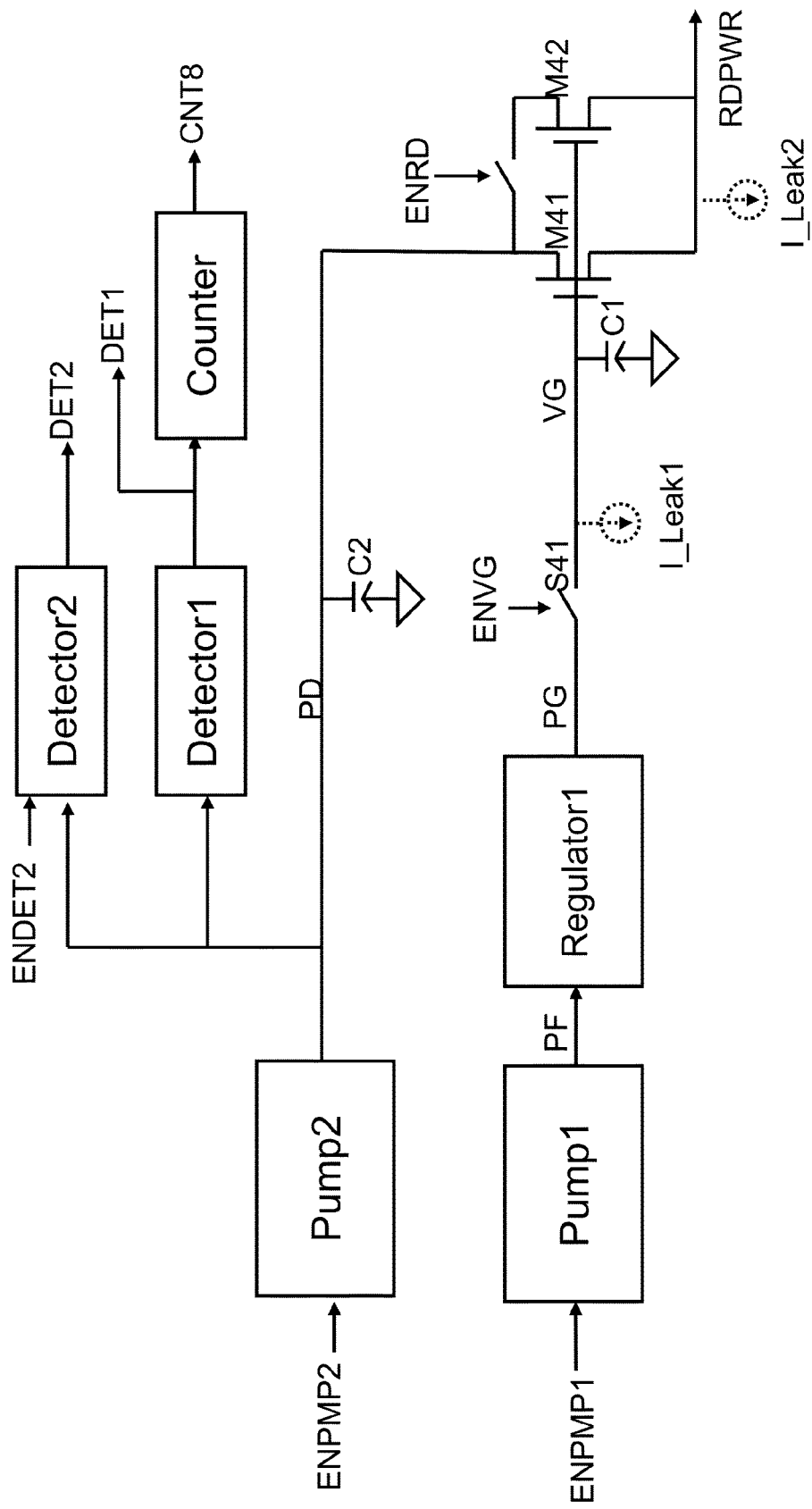
FIG. 1 is a block diagram of a charge pump system providing read power for a memory array.

FIG. 1 is a block diagram of a charge pump system providing read power for a memory array.

The voltage detectors, detetcor1 and detector2, do not detect the voltage of the RDPWR node. Instead, the voltage detectors detect the voltage of the PD node. The PD node and the RDPWR node are respectively the drain terminal voltage and the source terminal voltage of the transistor M41. In the shown embodiment the transistor M41 is a field effect transistor. In another embodiment, the transistor is a bipolar junction transistor.

The voltage at the RDPWR node is relatively unaffected by voltage variation at the PD node, so long as the transistor M41 remains in the saturation region of operation. In saturation, the drain voltage is past the saturation drain voltage for a particular gate voltage. In physical terms, in the saturation region the channel between the source and drain terminals has pinched off, at least by the drain terminal.

Voltage at the RDPWR node can be calculated as approximately, VRDPWR~VVG−VTN(M41), where VTN is the threshold turn on voltage for a particular transistor. The node VG is kept at a constant voltage. Stability of the voltage at node VG maintains steady saturation region characteristics of transistor M41. The voltage at node VG is regulated, rather than detected and refreshed, which addresses problems with the voltage detector accuracy in the alternative detect-and-refresh approach.

Capacitor C1 which is connected to node VG is floated for most of the time. Node VG has few connections, and the leakage current from node VG (shown as I_Leak1) is controlled to be small. Therefore voltage variation of the VG node is small.

If signal ENVG is off, turning off switch S41 and disconnecting nodes PG and VG, then node VG does not connect to any determined voltage, and leaving node VG floating. The voltage at node VG, VVG, is sustained by residual charge in capacitor C1, and gradually decreases due to current source I_leak1. Assuming I_leak1 is constant, VVG=VVG(at time t=0)−(I_leak1/C1*t), where time t=0 is the time that signal ENVG if off, turning off switch S41 and disconnecting nodes PG and VG, and t is the floating interval from t=0. VVG(at time t=0)=VPG.

Figure 4:
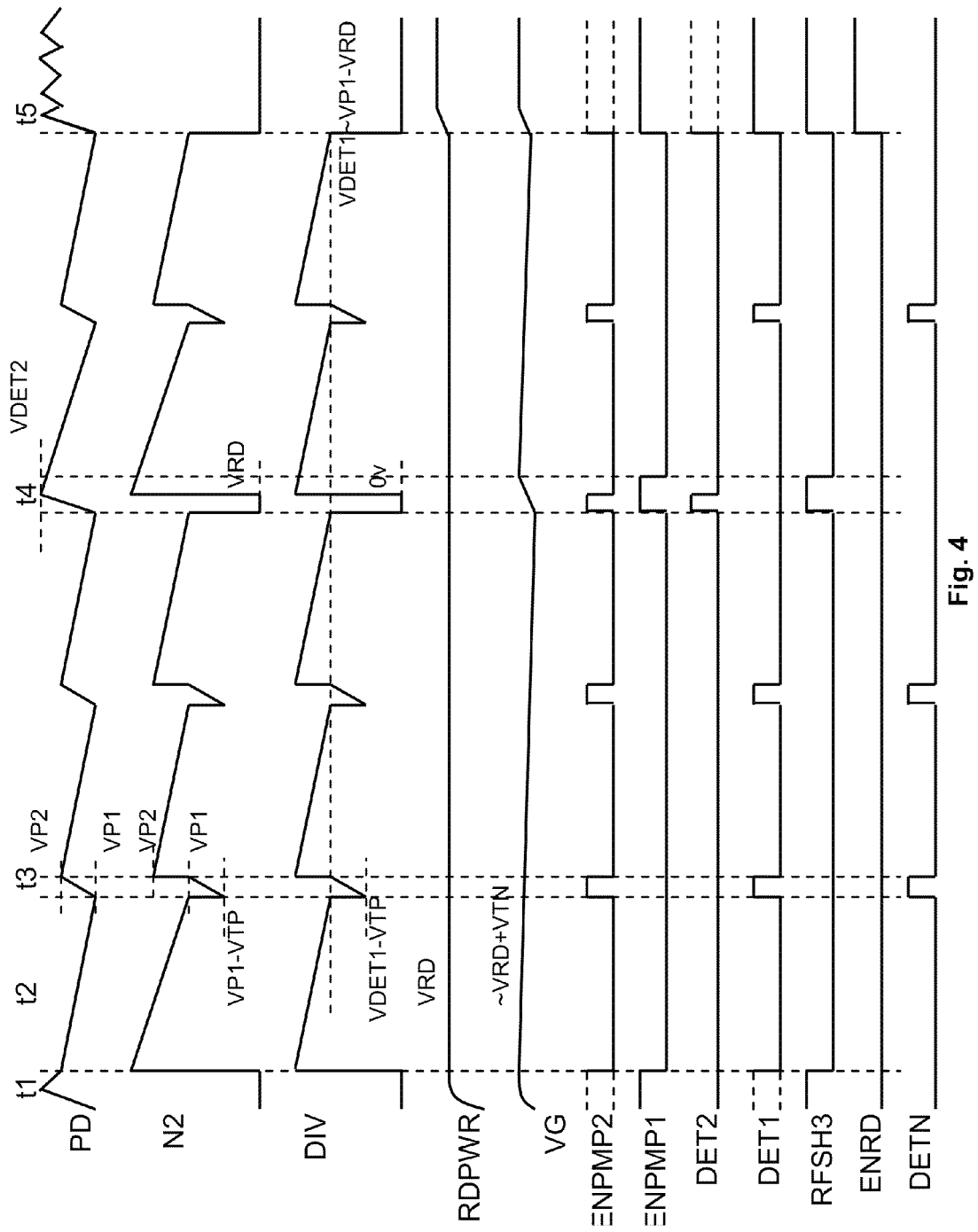
FIG. 4 is a timing diagram of signals in FIGS. 1-3.
Figure 7:
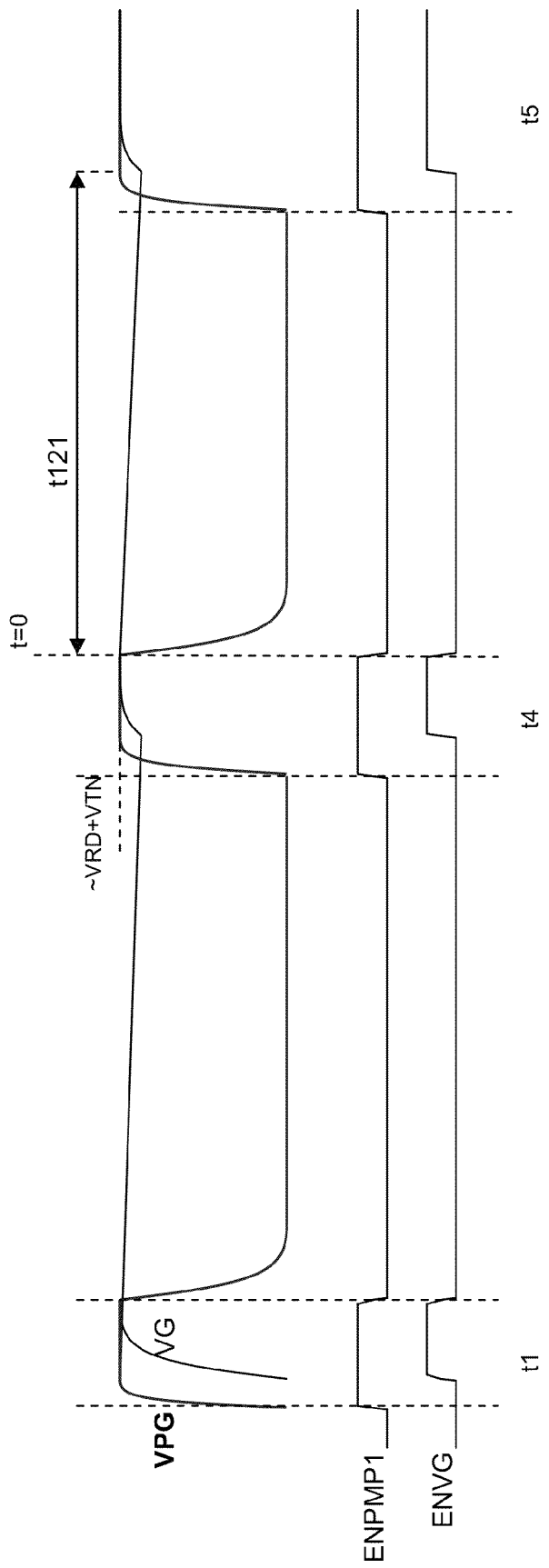
FIG. 7 is a timing diagram showing voltage refresh by voltage regulation.
Figure 9:
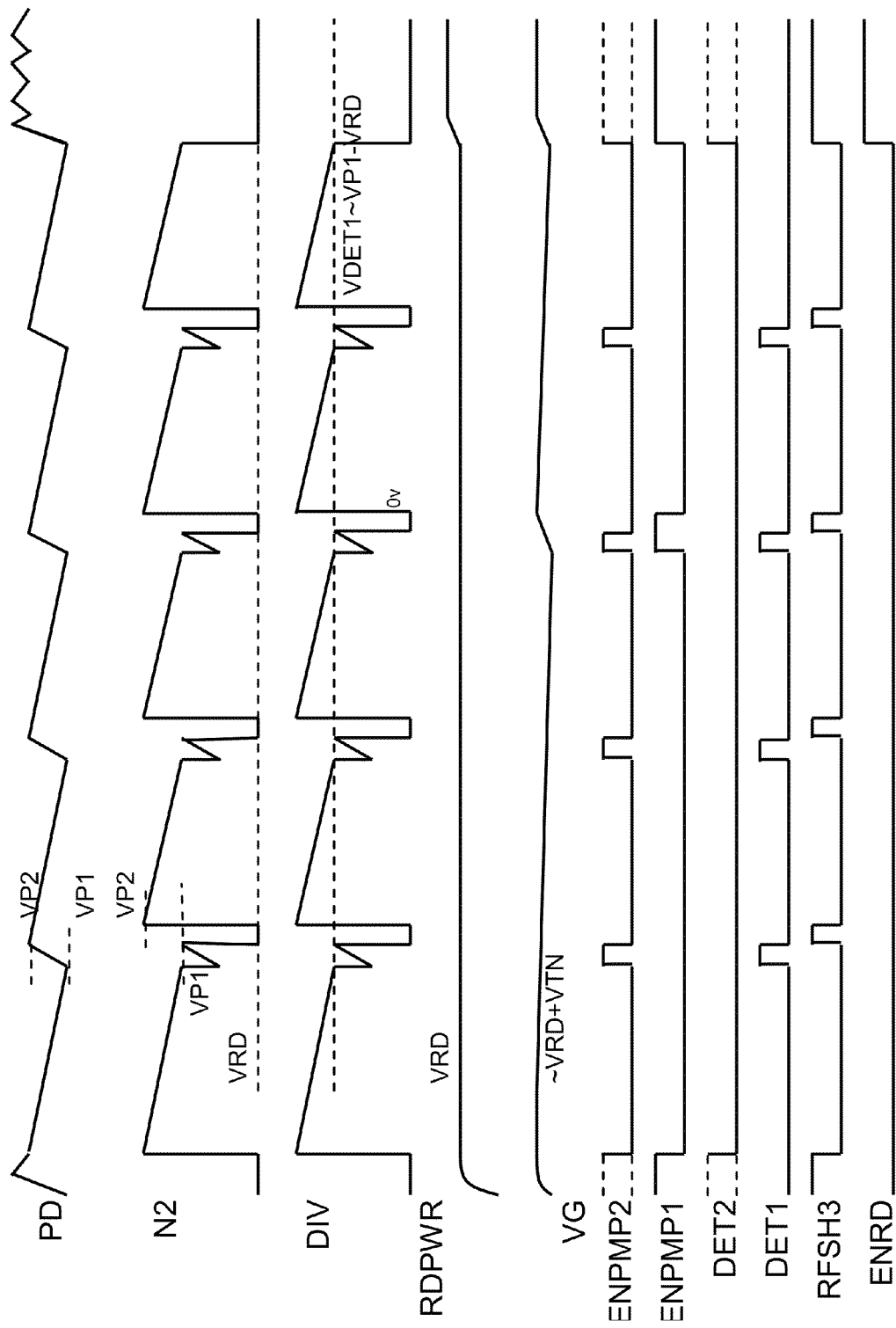
FIG. 9 is a timing diagram of signals in FIGS. 1-2 and 8.

The minimum voltage of VVG occurs on each rising edge of signal ENVG. The VVG variation ΔVVG=VVG(max)−VVG(min)=I_leak1/C1*t121. Time t121 is shown in FIG. 7. Example values are: I_leak1<1 nA, C1=10 pF, t121=200 µs. ΔVVG<20 mV, which is a very small variation. (VG waveform in FIGS. 4 and 9 are exaggerated in voltage scale.) An example VG voltage is around 6V, with variation of only about 0.33%.

The current sources I_Leak1 and I_Leak2 represent parasitic junctions and/or device off leakage. The magnitude of leakage from node RDPWR, I_Leak2, is much larger than leakage from node VG, I_Leak1. Charge leakage represented by I_Leak2 is replaced by charge from capacitor C2 which is connected between node PD and ground. I_Leak1 can be well controlled to be small by the limited node connections of node VG. I_Leak2 can be larger than I_Leak1 by 3 orders or more, because node RDPWR connects to thousands of X-decoders to read word lines WLs.

The voltage of node RDPWR is kept constant by this charge replacement and the separation of node RDPWR from the node PD which endures repeated cycles of leakage and charge pumping.

Both capacitors C1 and C2 are refreshed periodically. Two charge pumps perform the refresh function. Charge pump Pump1 (via Regulator1) refreshes node VG and capacitor C1 connected to node VG. Charge pump Pump2 refreshes node PD and capacitor C2 connected to node PD. In another embodiment, a single charge pump performs the functions of both Pump1 and Pump2.

The voltage detector Detector1 detects the voltage on node PD. Responsive to the output signal DET1 from voltage detector Detector1, the charge pump Pump2 refreshes node PD. Also responsive to the output signal DET1 from voltage detector Detector1, Counter increments a count of refreshing node PD and capacitor C2. In one embodiment, capacitor C1 is refreshed by charge pump Pump1 once, after every eighth time of refreshing capacitor C2. After every eighth time of refreshing capacitor C2, the count of Counter reaches 7, after which the CNT8 signal is generated from Counter to refresh capacitor C1, and the count of Counter resets to 0. In other embodiments, some other number than 8 is used, or some timer independent of capacitor C2 is used. After the Counter CNT8 signal is generated, the control logic generates the pump enable signal ENPMP1 to turn on Pump1 and generates the signal ENVG to close switch S41.

Charge pumps Pump1 and Pump2 are enabled by respective signals ENPMP1 and ENPMP2.

Transistor M42 is turned on when the circuit is ready to perform a read operation. The integrated circuit leaves standby mode, and signal ENRD is on. Transistor M42, which has greater driving strength than transistor M41, supplies read current drawn to RDPWR.

Figure 2:
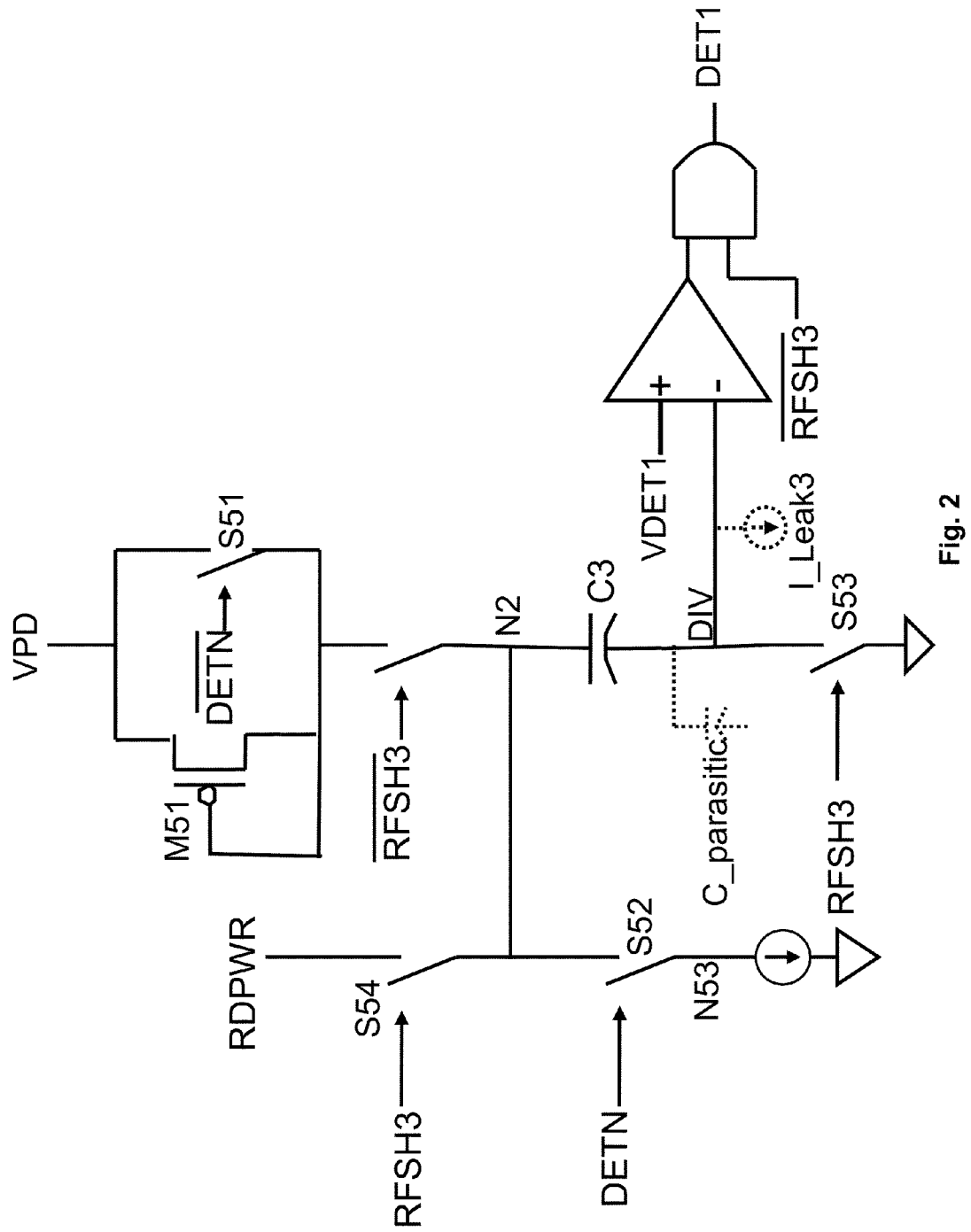
FIG. 2 is a circuit diagram of a voltage detector for the charge pump system of FIG. 1.

FIG. 2 is a circuit diagram of a voltage detector, Detector1, for the charge pump system of FIG. 1.

The voltage detector, Detector1, uses a capacitor C3 to perform voltage conversion from the voltage at the RDPWR node to the voltage at the DIV node. The capacitor does not consume any DC current. The characteristics of the voltage detector circuit in FIG. 2 are discussed in view of the timing diagram of FIG. 4, which was time windows t1 through t4. Time windows t1 and t2 are much longer than time windows t3 and t4.

Basically t1, t4 and t5 have the same purpose of refreshing capacitors C1 and C3. However, they have different triggering sources and different timing intervals. Capacitor C2 is also charged in phase t4.

Pulse widths of t1 and t4 are constant in some embodiments. The pulse width of t5 depends on how many read commands are issued externally.

Time t1 is an initialization phase that might charge capacitors C1 and C3 from zero voltage. It is triggered by power on or reset related signal. During time t1 in FIG. 4, capacitor C3 is refreshed. Node DIV connect to ground as switch S53 is closed responsive to signal RFSH3, and node N2 connects to RDPWR as switch S53 is closed responsive to signal RFSH3. Capacitor C3 charges to target read voltage VRD.

During time t2 in FIG. 4, leakage occurs from node PD. Node N2 connects to PD (shown as VPD) as the intermediate switch is closed responsive to RFSH complement and at the end of t2 the switch S51 is closed responsive to signal DETN complement, such that VN2=VPD~VP1 and VDIV~VDET1. Then signals DET1, ENPMP2 and DETN go high and switch S51 turns off. VN2 then drops to ~VPD−VTP. The relation VN2~VPD−VTP remains true.

Node DIV disconnect from ground as switch S53 is opened responsive to signal RFSH3, and node N2 disconnects from RDPWR as switch S53 is opened responsive to signal RFSH3.

In this configuration, the voltage VDIV of the node DIV is the following, where VN2 is the voltage of node N2, and VRD is the target read voltage which was set to be the voltage across capacitor C3 during time t1:

VDIV=VN2*(C3/(C3+C_parasitic))−VRD

Because capacitor C_parasitic is relatively small compared to capacitor C3, the voltage VDIV of the node DIV can be approximated as follows:

VDIV~VN2−VRD

The control signal for charge pump Pump2 is off, such that ENPMP2=0. Due to charge leakage from node PD, the voltage of the PD node decreases. This charge leakage is represented in FIG. 1 by current source I_Leak2 at the source terminal of transistor M41.

Such charge leakage from node PD continues, until the voltage of node DIV, VDIV, falls below the voltage VDET1, as detected by the voltage comparator which has as inputs both the voltage VDIV and the voltage VDET1. Another way to express this is that the voltage of node PD, VPD (which equals the voltage of node N2, VN2) falls below voltage VP1, where VP1=VDET1+VRD. Voltage VP1 represents the voltage sum of the voltage comparator input VDET1 and the VRD target read voltage which was set to be the voltage across capacitor C3 during time t1.

During time t3 in FIG. 4, capacitor C2 is refreshed. The control signal for charge pump Pump2 is on, such that ENPMP2=1. Switch S51 turns off responsive to signal DETN complement to disconnect node PD from node N2. Switch S52 turns on responsive to signal DETN, connecting node N2 with a current source which can be, for example, a current mirror, transistor with gate connected to a supply voltage, or simply a resistor. The voltage at node N2, VN2, becomes the voltage at node PD, VPD−VTP (transistor threshold voltage).

Meanwhile during time t3, as charge pump Pump2 is enabled, the voltage of node PD increases, until the voltage comparator determines that VDIV>VDET1. Another way to express this condition is that the voltage of node PD, VPD=VN2 (voltage of node N2)+VTN (transistor threshold voltage) exceeds the voltage VP2, where the voltage VP2=VDET1+VRD+VTN. Voltage VP2 represents the voltage sum of the voltage comparator input VDET1, the VRD target read voltage which was set to be the voltage across capacitor C3 during time t1, and the transistor threshold voltage. VDET1 determines the minimum voltage of node PD (VP1) in FIG. 4. In some embodiments VDET1 is in the range of 0.2V-1.0V. VDET1 is a reference voltage to the comparator. In one embodiment, VDET1 is the output of a comparator with the inputs of node DIV and the NMOS threshold VTN.

When this voltage comparator condition is fulfilled, then time t3 ends. The control signal for charge pump Pump2 is off, such that ENPMP2=0. Due to charge leakage, the voltage of node PD again gradually decreases until the voltage detector activates Pump2 again. P-type transistor M51 helps determine the voltage difference between VP1 and VP2 (FIG. 4). Voltages VP1 and VP2 are respectively the low and high values of the voltage at node PD. After a period of leakage, node PD has voltage VP1, and after refresh by charge pump Pump2, node PD has voltage VP2.

The control signal for charge pump Pump2 is off, such that ENPMP2=0. Due to charge leakage, the voltage of node PD again gradually decreases until the voltage detector activates Pump2 again. P-type transistor M51 determines the voltage difference between VP1 and VP2 (FIG. 4). Transistor M51 can be replaced with another device to determine the voltage drop between VP1 and VP2, such as a diode or an n-type transistor.

At the end of t3, VN2~VP1; VPD~VN2+VTP~VP1+VTP=VP2. Then switch S51 shorts again, and VN2 ramps up sharply to VPD=VP1+VTP.

After time t3 ends, then times t2 and t3 subsequently repeat, with occasional replacement of t3 with t4.

Time t4 happens periodically when triggered by Counter in FIG. 1. In some embodiments t1>t4. During t4, charge pump Pump1 is enabled by ENPMP1=1. The pulse width of ENPMP1 is determined by the delay element D61. Both charge pumps Pump1 and Pump2 activate to refresh capacitor C3. To refresh capacitor C3, switches S53 and S54 turn on, and switches S51 and S52 turn off. In some embodiments, t4<<t2.

Time t5 is triggered by an external read command. During time t5, the circuit is ready to perform a read operation and signal ENRD is on. Following the read operation, the circuit returns to standby. After t5, the system returns to the beginning of t2. The standby states of the system are t2, t3 and t4.

In other embodiments, the voltage detector is a standalone voltage detector consuming no DC-current. the voltage detector can be used with systems other than a standby charge pump system In another embodiment, a single voltage detection point is sufficient. Switches S51 and S52 can be removed.

Figure 3:
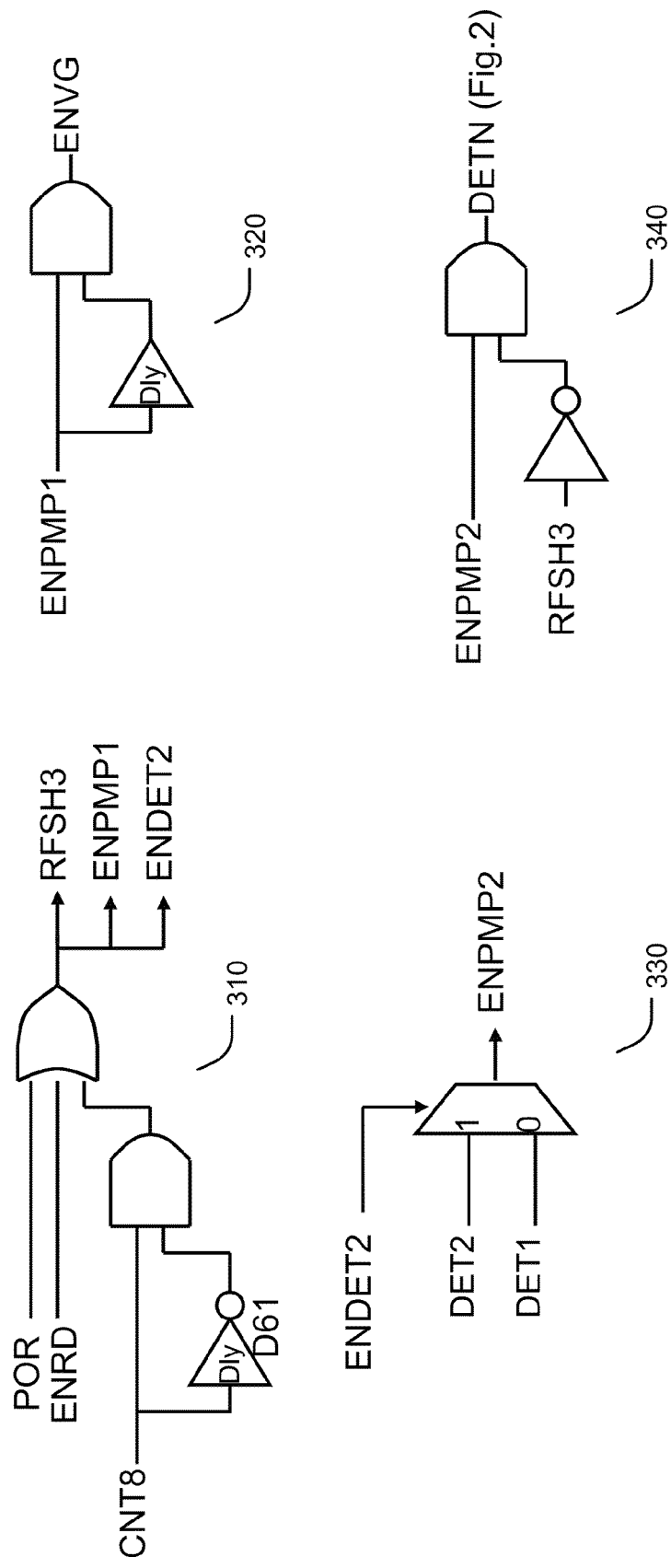
FIG. 3 is a circuit diagram of control logic generating control signals in FIGS. 1 and 2.

FIG. 3 is a circuit diagram of control logic generating control signals in FIGS. 1 and 2.

Control logic 310 generates the signals RFSH3 to refresh the capacitor C3 of FIG. 2, ENPMP1 to enable charge pump Pump1, and ENDET2 to enable the voltage detector Detector2. There are three separately sufficient conditions.

First, signal CNT8 from the Counter of FIG. 1 indicates that charge pump Pump1 is to be enabled. The pulse widths of the three generated signals are determined by the delay element D61.

Second, the there is a POR (power-on reset) signal.

Third, the integrated circuit is ready to perform a read operation. The integrated circuit leaves standby mode, and signal ENRD is on. Following the read operation, the circuit returns to standby.

In control logic 320, signal ENVG to turn on switch S41 in FIG. 1 is generated after a delay generated by the delay element, following the signal ENPMP1 which enabled charge pump Pump1.

In control logic 330, a 2-to-1 multiplexer selects between signals DET1 and DET2 responsive to selection signal ENDET2. The multiplexer output signal is signal ENPMP2. Whether charge pump Pump2 is enabled is determined by either the output of voltage detector Detector1 or the output of voltage detector Detector2, as selected by signal ENDET2 which enables voltage detector Detector2.

In control logic 340, signal DETN which turns on switch S52 in FIG. 2 is generated when signal ENPMP2 is enabling the charge pump Pump2, and the capacitor C3 in FIG. 2 is not being refreshed.

FIG. 4 is a timing diagram of signals in FIGS. 1-3, and is discussed in connection with FIG. 2.

Figure 5:
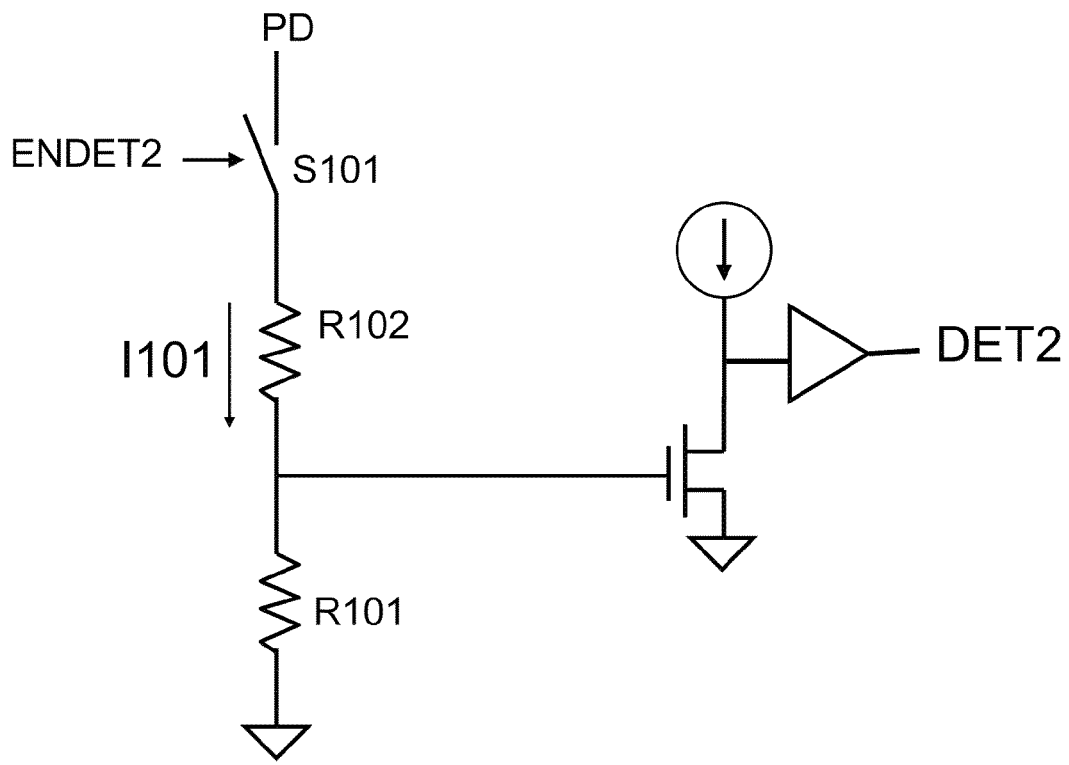
FIG. 5 is a circuit diagram of Detector2 for the charge pump system of FIG. 1.

FIG. 5 is a circuit diagram of another voltage detector for the charge pump system of FIG. 1.

In particular, the voltage detector shown in FIG. 5 is an example of voltage detector Detector2 in FIG. 1.

Switch S101 is turned on by signal ENDET2. Switch S101 connects node PD with a voltage divider of current I101 through series resistors R102 and R101 to ground. The intermediate node is connected to the gate of a transistor having a drain connected to ground and a source connected to a current source and an amplifier which outputs signal DET2.

The voltage detector Detector2 consumes charge pump current during the time that ENDET2 enables the voltage detector Detector2. This would impact standby current consumption. However, because the ENDET2 enable signal is limited to a short period t4<<t3 (for example, t4 and t3 in FIG. 4), the average power consumption can be little. This is an improvement over other voltage detectors that consume charge pump current all the time.

For these reasons, the current flow through the voltage division circuit can be larger, which results in faster response time.

The voltage division circuit current $I101=VPD/(R101+R102)$. Because current can be larger, the resistances of R101 and R102 can be smaller. The layout costs of the resistors can be decreased. Parasitic capacitances of the resistor can be smaller.

The detector level of voltage detector Detector2 is VDET2. $VDET2=VTN*(1+(R102/R101))$. If VPD<VDET2, then DET2=1. Otherwise DET2=0.

Figure 6:
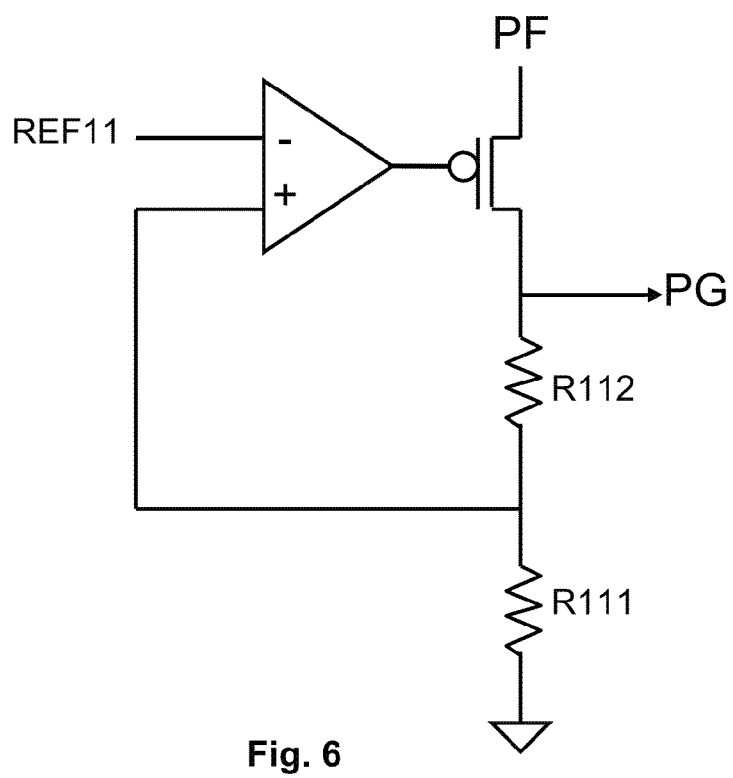
FIG. 6 is a circuit diagram of a voltage regulator for the charge pump system of FIG. 1.

FIG. 6 is a circuit diagram of a voltage regulator for the charge pump system of FIG. 1.

Regulator1 is a voltage generator. The node PF is directly output from charge pump Pump1, so the voltage of node PF is unstable. The voltage of node PF, VPF, has a large ripple, and in addition may vary with supply voltage VCC and vary with temperature. This voltage regulator changes unstable voltage at node PF, VPF, to a stable voltage at node PG, VPG.

The input voltage is VPF from node PF at the output of charge pump Pump1. The output voltage VPG at node PG is:
$VPG=VREF11*(1+(R112/R111))$ during the time t4 of FIG. 4.

VREF11 can be generated by a bandgap reference voltage generator.

An op amp has an inverting input connected to REF11, a noninverting input connected in a feedback loop, and an output connected to the gate of p-type transistor. The p-type transistor has a source connected to node PF, and a drain connected to node PG. Node PG is connected to ground via series resistors R112 and R111. The node between series resistors R112 and R111 is connected to the noninverting input of the op amp.

FIG. 7 is a timing diagram showing voltage refresh by voltage regulation. The voltage of node PG, VPG, is determined as described. So node VG is refreshed to the voltage VPG, so long as the ENPMP1 pulse width is wide enough. Signal ENVG, which turns on switch S41 between nodes PG and VG, should turn on after VPG is set to the desired voltage.

Accordingly, capacitor C1 is refreshed by regulation, and capacitor C2 is refreshed by detect-and-refresh. Since node RDPWR is approximately VVG−VTN if transistor M41 is kept in saturation, the VPD sawtooth waveform is unimportant.

Figure 8:
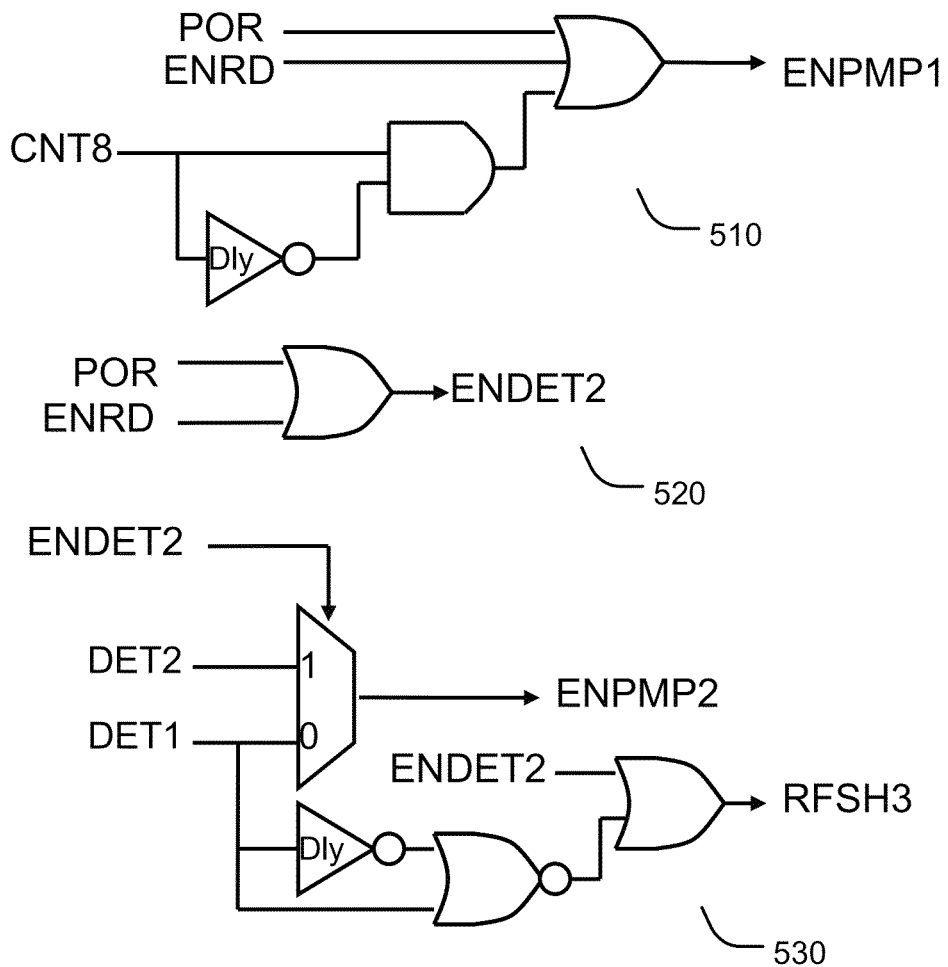
FIG. 8 is a circuit diagram of another embodiment of control logic generating control signals in FIGS. 1 and 2.

FIG. 8 is a circuit diagram of another embodiment of control logic generating control signals in FIGS. 1 and 2.

In this embodiment of control logic, the capacitor C3 is refreshed each time capacitor C2 is refreshed.

Control logic 510 is similar to control logic 310. However, control logic 510 generates ENPMP1 to enable charge pump Pump1, but generates neither the signals RFSH3 to refresh the capacitor C3 of FIG. 2 nor ENDET2 to enable the voltage detector Detector2.

Control logic 520 generates signal ENDET2 to enable the voltage detector Detector2. Control logic 520 is responsive to receiving either a POR (power-on reset) signal, or the integrated circuit is ready to perform a read operation and receives signal ENRD.

Control logic 530 combines control logic 330 with additional logic to generate signal RFSH3. RFSH3 is responsive to signal ENDET2 to enable the voltage detector Detector2. RFSH3 is also responsive to signal DET1 indicating that voltage detector Detector1 has found that capacitor C2 should be refreshed; RFSH3 is delayed so that capacitor C3 is refreshed shortly after capacitor C2 is refreshed.

FIG. 9 is a timing diagram of signals in FIGS. 1-2 and 8.

Figure 10:
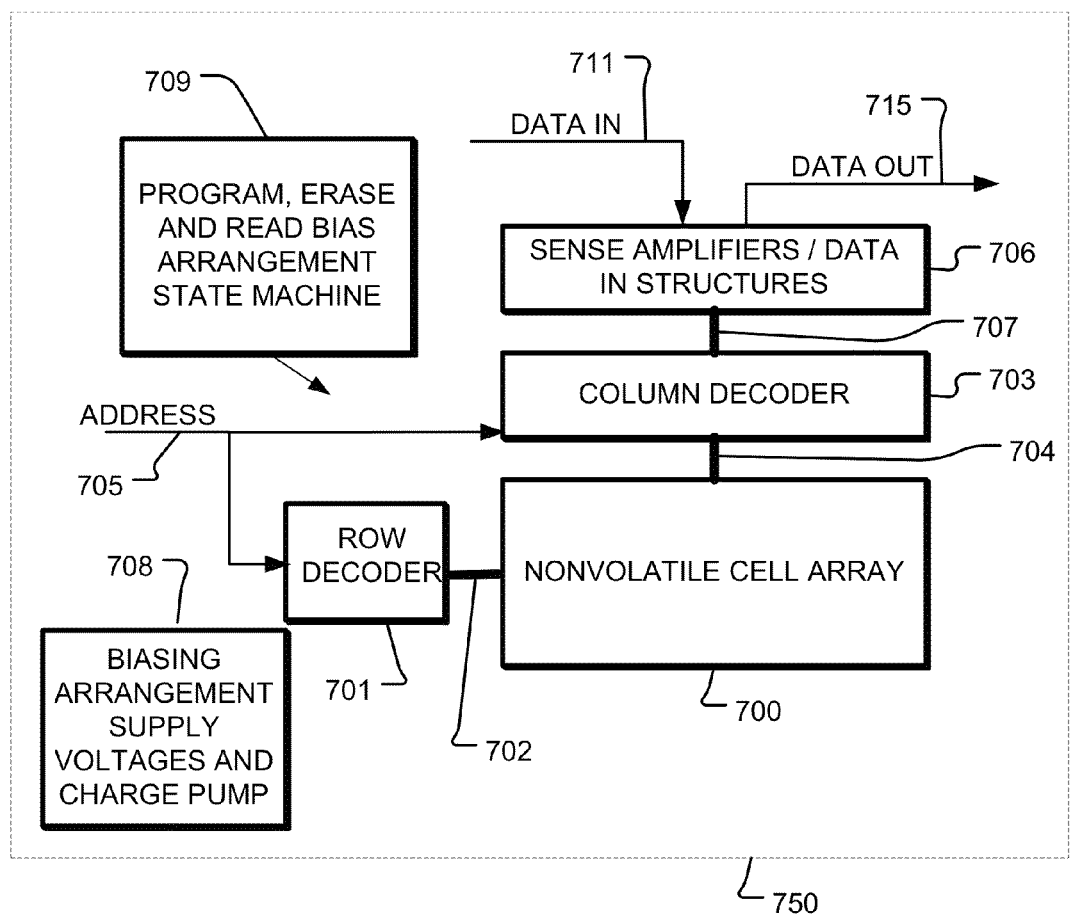
FIG. 10 is a block diagram of an integrated circuit with the read power system described herein.

FIG. 10 is a block diagram of an integrated circuit with the read power system described herein.

An integrated circuit 750 includes a memory array 700. A word line decoder 701 is coupled to and in electrical communication with a plurality of word lines 702 arranged along rows in the memory array 700. A bit line (column) decoder 703 is in electrical communication with a plurality of bit lines 704 arranged along columns in the array 700. Addresses are supplied on bus 705 to the word line decoder 701 and bit line decoder 703. Sense circuitry (Sense amplifiers) and data-in structures in block 706, including voltage and/or current sources are coupled to bit line decoder 703 via data bus 707.

Data is supplied via a data-in line 711 from input/output ports on integrated circuit 750, or from other data sources internal or external to integrated circuit 750, to data-in structures in block 706. Other circuitry may be included on integrated circuit 750, such as a general purpose processor or special purpose application circuitry, or a combination of modules providing system-on-a-chip functionality supported by array 700. Data is supplied via a data-out line 715 from the sense amplifiers in block 706 to input/output ports on integrated circuit 750, or to other data destinations internal or external to integrated circuit 750.

A controller 709 implemented in this example, using a bias arrangement state machine, controls the application of charge pump circuitry, bias circuitry voltage and current sources 708 for the application of bias arrangements including read, program, erase, erase verify and program verify voltages and/or currents for the word lines and bit lines. Controller 709 may be implemented using special-purpose logic circuitry as known in the art. In alternative embodiments, controller 709 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 709.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An apparatus comprising:
   a first charge pump having a first charge pump output; and
   a voltage shifter including a capacitor, the capacitor having:
      a first terminal coupled to the first charge pump output; and
      a second terminal,
      wherein the capacitor shifts a first voltage level at the first terminal to a second voltage level at the second terminal; and
   pump control logic enabling the first charge pump responsive to the second voltage level of the voltage shifter,
   wherein a voltage difference between the first voltage level and the second voltage level across the capacitor is refreshed at a first refresh rate determined by a second refresh rate of the first charge pump output,
   wherein the first refresh rate characterizes a second charge pump with a second charge pump output coupled to a control terminal of a transistor.

2. The apparatus of claim 1, wherein the voltage shifter blocks dc current from the charge pump output through the voltage shifter.

3. The apparatus of claim 1, wherein a voltage difference between the first voltage level and the second voltage level across the capacitor is set by a target voltage of the charge pump output.

4. The apparatus of claim 1, further comprising:
   a circuit element having a first voltage difference that at least partly determines a refresh voltage difference between a peak voltage and a valley voltage at the charge pump output, wherein the circuit element is switchably coupled into a circuit path between the charge pump output and the first terminal of the voltage shifter.

5. A method comprising:
   shifting a first voltage level at a first capacitor terminal of a capacitor coupled to a first charge pump output of a first charge pump to a second voltage level at a second capacitor terminal of the capacitor; and
   enabling the first charge pump responsive to the second voltage level,
   wherein a voltage difference between the first voltage level and the second voltage level across the capacitor is refreshed at a first refresh rate determined by a second refresh rate of the first charge pump output, and
   wherein the first refresh rate characterizes a second charge pump with a second charge pump output coupled to a control terminal of a transistor.

6. The method of claim 5, wherein a voltage shifter including the capacitor blocks dc current from the charge pump output through the voltage shifter.

7. The method of claim 5, wherein a voltage difference between the first voltage level and the second voltage level across the capacitor is set by a target voltage of the charge pump output.

8. The method of claim 5, further comprising:
   switchably coupling a circuit element having a first voltage difference into a circuit path between the charge pump output and the first terminal of the voltage capacitor, the first voltage difference at least partly determining a refresh voltage difference between a peak voltage and a valley voltage at the charge pump output.

9. An apparatus comprising:
   a transistor having:
      a first current carrying terminal coupled to an output node providing a word line read voltage;
      a second current carrying terminal coupled to a first charge pump output of first charge pump circuitry; and
      a control terminal; and
   the charge pump circuitry having the first charge pump output and providing power to the output node via the transistor,
   wherein a first refresh rate of a control terminal voltage on the control terminal is determined by a second refresh rate of the first charge pump output, and
   wherein the first refresh rate characterizes a second charge pump with a second charge pump output coupled to a control terminal of the transistor.

10. The apparatus of claim 9, wherein the transistor is a field effect transistor, the first current carrying terminal is a source, the second current carrying terminal is a drain, and the control terminal is a gate.

11. The apparatus of claim 9, wherein the transistor operates in a saturation region.

12. The apparatus of claim 9, wherein the transistor operates in a saturation region such that voltage fluctuation at the charge pump output is decreased at the output node.

13. The apparatus of claim 9, wherein charge leakage from the output node is counteracted by current flow through the transistor between the second current carrying terminal and the first current carrying terminal.

14. The apparatus of claim 9, wherein the charge pump circuitry includes a second charge pump output coupled to the control terminal of the transistor.

15. The apparatus of claim 9, wherein the charge pump circuitry includes a second charge pump output coupled to the control terminal of the transistor, and a voltage regulator maintains a control terminal voltage at the control terminal.

16. A method comprising:
operating a transistor in saturation, the transistor having a first current carrying terminal coupled to an output node providing a word line read voltage and a second current carrying terminal coupled to a first charge pump output, such that voltage fluctuation at the first charge pump output is decreased at the output node; and
refreshing a control terminal voltage on a control terminal of the transistor at rate determined by a first refresh rate of the first charge pump output,
wherein the first refresh rate characterizes a second charge pump with a second charge pump output coupled to a control terminal of the transistor.

17. The method of claim 16, wherein the transistor is a field effect transistor, the first current carrying terminal is a source, the second current carrying terminal is a drain, and the control terminal is a gate.

18. The method of claim 16, wherein charge leakage from the output node is counteracted by current flow through the transistor from the second current carrying terminal to the first current carrying terminal.

19. The method of claim 16, comprising:
maintaining a control terminal voltage at the control terminal by charge pumping.

20. An apparatus comprising:
a transistor having:
 a first current carrying terminal coupled to an output node providing a word line read voltage;
 a second current carrying terminal coupled to a charge pump output of charge pump circuitry; and
 a control terminal,
wherein a first refresh rate of a control terminal voltage on the control terminal is determined by a second refresh rate of the charge pump output; and
the charge pump circuitry providing power to the output node via the transistor, including:
 a first charge pump including the charge pump output; and
 a second charge pump with a second charge pump output coupled to the control terminal of the transistor.

* * * * *